United States Patent
Andritzke et al.

(10) Patent No.: US 8,168,036 B2
(45) Date of Patent: May 1, 2012

(54) APPARATUS AND METHOD FOR THE REMOVAL OF PELLICLES FROM MASKS

(75) Inventors: Lothar Andritzke, Mueglitztal/OT Maxen (DE); Holger Brosche, Dresden (DE); Steffen Krueger, Triebischtal/OT Robschuetz (DE); Steffen Pollack, Dresden (DE); Klaus-Peter Weiss, Pirna (DE); Hans-Joachim Gretzschel, Dresden (DE)

(73) Assignee: HAP Handhabungs-, Automatisierungs- und Präzisionstechnik GmbH, Dresden (DE)

( * ) Notice: Subject to any disclaimer, the term of this patent is extended or adjusted under 35 U.S.C. 154(b) by 607 days.

(21) Appl. No.: 12/330,652

(22) Filed: Dec. 9, 2008

(65) Prior Publication Data

US 2009/0239156 A1    Sep. 24, 2009

(30) Foreign Application Priority Data

Dec. 18, 2007   (DE) .......................... 10 2007 063 383

(51) Int. Cl.
*B32B 38/10* (2006.01)
(52) U.S. Cl. ........ 156/711; 156/714; 156/752; 156/764; 156/922; 156/937
(58) Field of Classification Search .................. 156/714, 156/764, 711, 752, 922, 937
See application file for complete search history.

(56) References Cited

U.S. PATENT DOCUMENTS

| | | | |
|---|---|---|---|
| 4,255,216 A * | 3/1981 | Conant et al. .................... | 156/80 |
| 5,168,993 A | 12/1992 | Yen | |
| 5,772,842 A | 6/1998 | Tanaka et al. | |
| 5,976,307 A * | 11/1999 | Cook, Jr. ........................ | 156/701 |
| 6,300,019 B1 | 10/2001 | Ikeda et al. | |
| 6,317,197 B1 * | 11/2001 | Li et al. ........................... | 355/74 |
| 6,527,031 B1 * | 3/2003 | Yanagita et al. ............... | 156/757 |
| 6,765,645 B1 * | 7/2004 | Lee et al. ........................ | 355/30 |

FOREIGN PATENT DOCUMENTS

| | | |
|---|---|---|
| EP | 0 942 325 | 9/1999 |
| JP | 06-175356 | 6/1994 |
| JP | 08-076361 | 3/1996 |

* cited by examiner

*Primary Examiner* — Mark A Osele
(74) *Attorney, Agent, or Firm* — Fay, Kaplun & Marcin, LLP

(57) ABSTRACT

An apparatus and a method for the removal of pellicles from masks which can be used for photolithographic purposes. The pellicles are removed from masks in a universal manner without them being further contaminated or damaged. In an apparatus, at least one grip is present for the manipulation of masks provided with pellicles which has at least two fixing elements which engage at the edge of a mask with exerted pressure force. There are moreover present in this connection at least one detector for the contactless determination of the position of mounts formed at the radially outer edge of pellicles, and a heating device for the heating of an adhesive with which pellicles are fastened to a mask with material continuity, and a removal apparatus of the pellicles from a mask having a mask fixing unit and a pellicle removal unit.

16 Claims, 5 Drawing Sheets

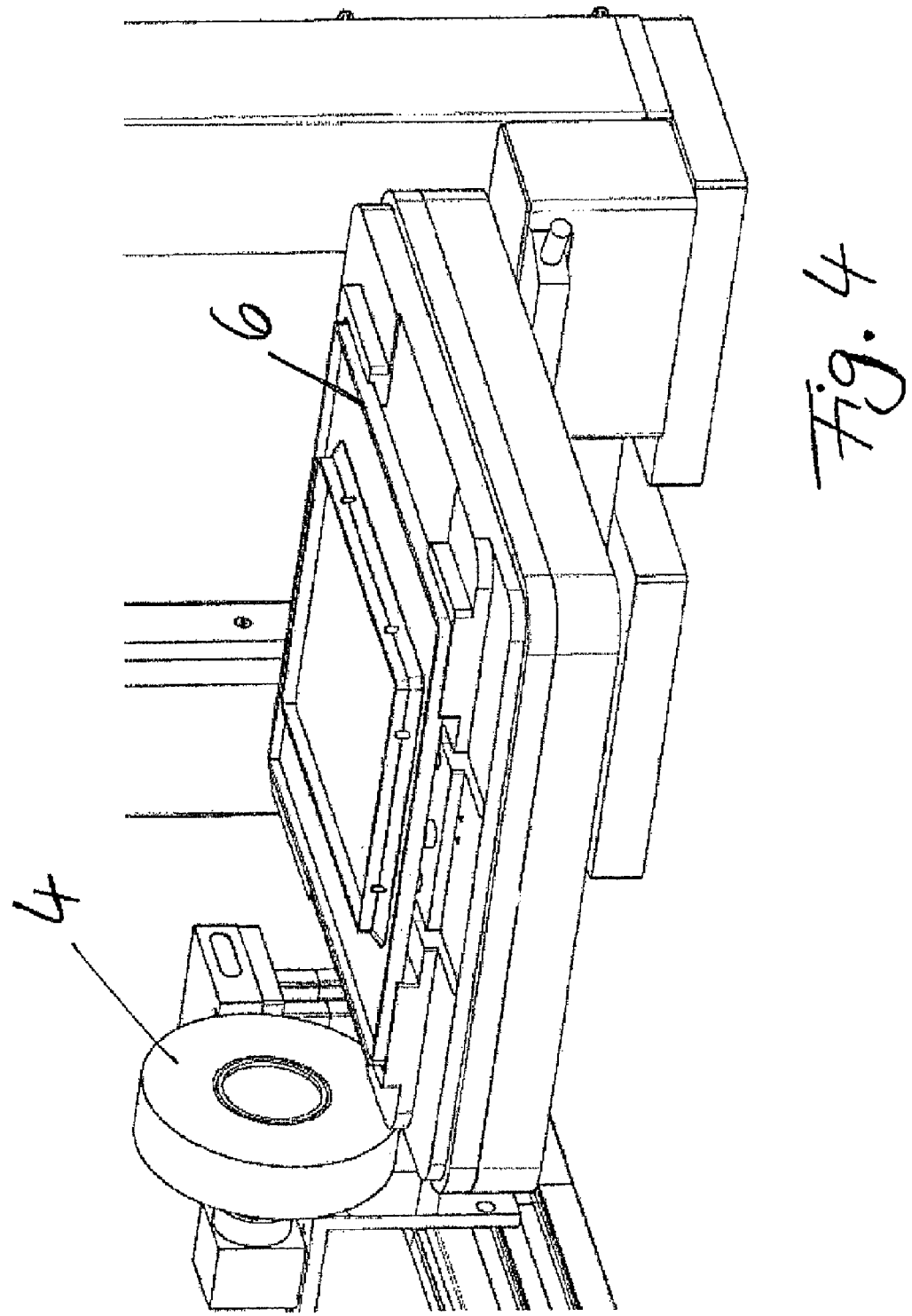

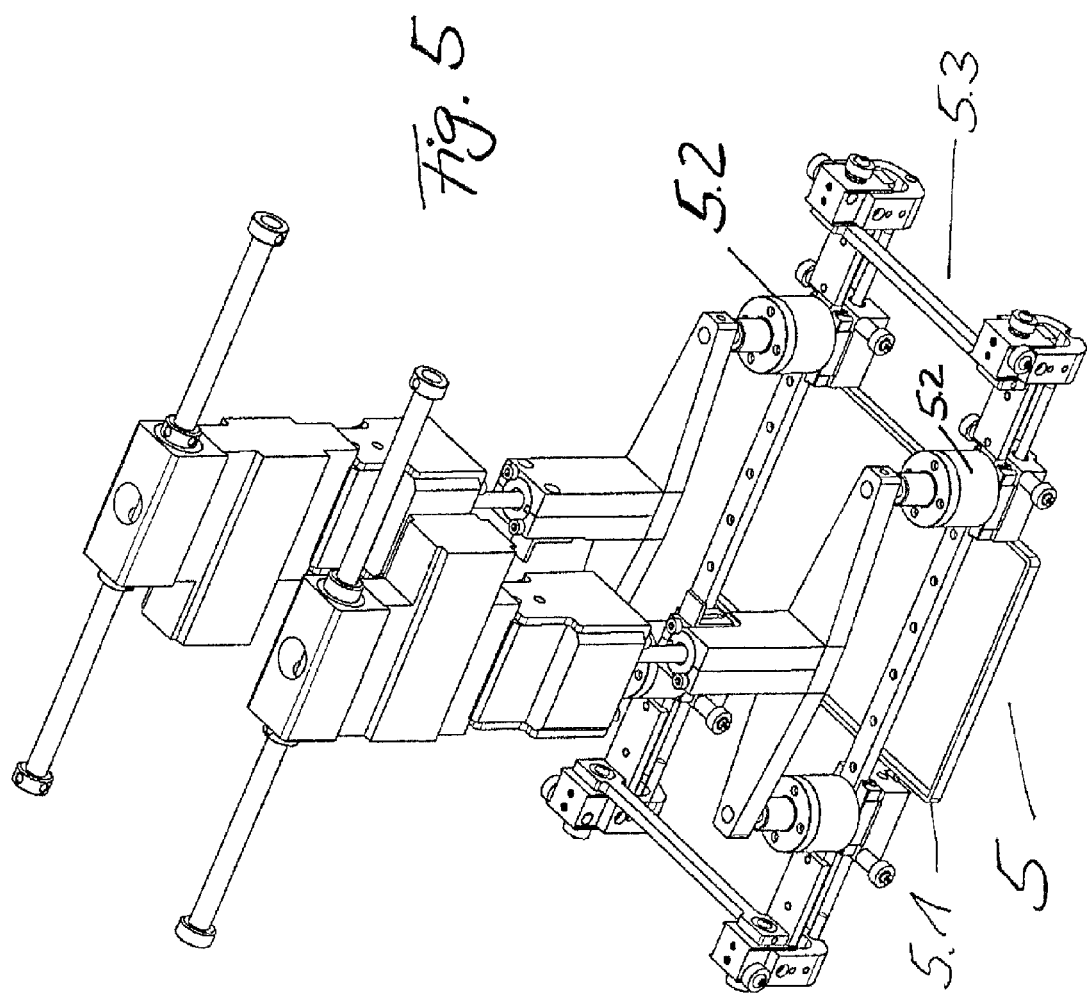

APPARATUS AND METHOD FOR THE REMOVAL OF PELLICLES FROM MASKS

PRIORITY CLAIM

This application claims priority to DE Patent Appln. Serial No. 10 2007 063 383.3 filed on Dec. 18, 2007 and which is expressly incorporated herein, in its entirety, by reference.

FIELD OF INVENTION

The invention relates to an apparatus and to a method for the removal of pellicles from masks which can be used for photolithographic purposes.

BACKGROUND INFORMATION

It has long been usual, in particular in the manufacture of miniaturized semiconductor components, to use masks provided with structures to produce structures of very filigree design in a photolithographic manner on substrates (wafers) for electronic circuits. In this connection, high demands are made on the masks, in particular on the useable structures formed on them. However, this also relates to their purity and protection against adhering particles is thus desired.

Since the sizes of the structures to be formed on the respective substrates have been made smaller and smaller in the more recent past, the corresponding demands on purity and freedom from defects of masks during use have increased. Masks have thus been provided with so-called pellicles. Pellicles are protective elements for the mask structure. They consist of a frame and of a membrane optically transparent in the photolithographic application. The pellicle is then connected with material continuity to the mask using adhesive at a lower side of the frame which is disposed opposite the side of the pellicle at which the membrane is connected to the frame. The mask structure is thus protected by the pellicle and its membrane. Since the membrane is arranged at a spacing from the structured surface of the mask, particles adhering to the membrane can be imaged out of the focal length during the exposure procedure and not on the respective substrate surface so that no exposure errors are caused by particles.

It has, however, been found that defects can occur directly at the mask structure during use. However, they cannot be eliminated or corrected due to the pellicle arranged in front of them. A temporary removal of pellicles is required for this purpose.

Such a removal has previously almost only been carried out manually. In this connection, the respective mask is heated so that the adhesive used softens and then a pellicle can be removed from the mask by hand by an operator. It is obvious that this represents an unsatisfactory state and the required purity demands can thus not be observed to the required degree.

Mounts for handling are formed at the frames, and indeed at their radially outer edges. The pellicles used are, however, neither normed nor standardized so that pellicles can have different dimensions as regards e.g. the geometrical design and the dimensioning. Frames can have different heights so that different spacings of the membrane of pellicles to the mask surface can occur. This also applies to the mounts. Different adhesives are used for the connection with material continuity which can accordingly also have properties which differ from one another, that is, also different detachment behavior.

A large number of these differences could previously be taken into account by an operator by the manual operation. In addition to the already mentioned purity concerns, however, it was not possible to avoid incorrect actions of operators sufficiently so that damage to or even the destruction of cost-intensive masks occurred which then had to be replaced by newly prepared masks.

SUMMARY OF INVENTION

The present invention relates to removal pellicles from masks in a universal manner without the masks being further contaminated or damaged.

An apparatus in accordance with the invention can in this respect be made in very complex form in order in particular to avoid manual work procedures which may still be necessary, but at least to reduce them to a much smaller minimal degree than was previously the case.

A grip can preferably be used for the manipulation of masks with whose help masks can be aligned and transported. For this purpose, a secure fixing of the masks on their movement is desired, but also a simple release of the fixing. Damage to the masks should, however, be avoided. The respective mask can then be held at two oppositely disposed sides by means of two fixing elements, which engage at preferably three points at the radially outer edge of the mask, in a force-transmitting and shape-matched manner by application of a compression force and a corresponding design of holding elements on the fixing elements. The compressive forces acting via the fixing elements should in the respect preferably be applied by the action of spring force. A drive for a movement for the release of the fixing of the fixing elements should then only be used for the release procedure or for the opening of the grip. Tension springs can preferably be used which are fixedly fastened to the grip at one side and are connected to a fixing element at the other side. At least one spring should be present for each fixing element. The fixing elements can be guided in a longitudinal guide. A drive, optionally having a transmission, is then activated for the opening of a grip so that a force acting against the spring force of the springs can be generated which is greater than the spring forces and the fixing elements and the mask can thereby be brought out of engagement. This movement can be initiated by the drive movement via levers of a lever transmission which are connected to the fixing elements.

A drive, for example a suitable electric motor, can, however, also move eccentric elements so that the fixing elements can thereby also be moved away from the outer edge of the respective mask or they can be moved apart. When masks are held by such a grip, reproducible forces therefore act which are always the same with a linear spring constant without additional measures being necessary.

Since, as already mentioned in the introductory part of the description, different pellicles can be fastened to masks, a detector should also be present with which the position of mounts arranged at the radially outer edge of the respective pellicle are determined in a contactless manner. It can preferably be a video camera with image processing. A mask is then positioned with respect to the detector, optionally by means of a previously described grip, and the determination of positions of the mounts on the pellicle is then carried out. It can be necessary for this purpose to move the pellicle in linear fashion along at least one axis. The pellicle can in this connection be placed in a defined manner on a support, e.g. on a carriage/work table. The determination of the mount positions can in this connection only take place at a side of the pellicle. It is important in this respect to determine the spacing of at least one mount from the mask. If at least the position of one of the normally four mounts is known, the three further positions can be calculated and be utilized for the control of a removal apparatus of the pellicles.

After determining the mount positions, the respective mask can then be transported to the removal apparatus and set down in a mask fixing unit, which is possible with stops engaging at the outer edge of the mask. A heating device can be provided at the removal device, preferably beneath the mask, with which the heating can be carried out to release the bond of the adhesive with material continuity. A heating element can be used for this purpose which emits suitable electromagnetic radiation and directs it to the mask.

The pellicle removal unit is then controlled while taking account of the determined positions of the mounts at the pellicle. Spikes introducible into the mounts are moved for this purpose. They are first moved with respect to the mount positions, with the spacing of the mounts to one another and to the mask surface being taken into account. If the introducible spikes are aligned with respect to the mounts, they be moved without risk in a linear fashion and in so doing be introduced into the mounts without themselves, the mask or the pellicle being damaged. If the spikes are introduced into the mounts, a pulling force effect can be exerted via the spikes to detach the pellicle from the mask. Said force effect should preferably act perpendicular to the plane which is preset by the mask.

In this respect, four removal drives can be advantageously used which are supported at an abutment of the pellicle removal unit and/or of the mask fixing unit. The pellicle can thus be detached from the mask by the pulling force effect in conjunction with the reduced adhesive effect of the adhesive as a result of the heating.

In this respect, it is advantageous to proceed in steps. This means that the effective pulling force is increased successively in stepped form. After reaching a stage with increased pulling force, it can be kept constant over a presettable holding time before the pulling force is again increased by a presettable amount in a subsequent step. The respective increase in the pulling force from step to step with a constant amount can, however, also take place variably. In the last-named case, this can take place while taking account of the instantaneous mask temperature and/or of a force or of a torque measured. The detachment behavior, and optionally also the instantaneous state, on the detaching of the pellicle can thereby be taken into account. The removal can be terminated in that it can be determined that the connection with material continuity has been released and a drop in the measured pulling force or in the torque has been recognized.

The detachment of the pellicle can thereby be accelerated further and the risk of damage can be reduced if an irregular pulling force effect is exerted on the pellicle, that is, a greater pulling force is preferably exerted at one mount via the spike introduced therein than at the other mounts. This can be achieved using a removal drive which, for example, has a larger inner piston diameter of a cylinder and/or a greater internal pressure acting there. The internal pressure can also be controlled or regulated such that the pulling force difference is influenced and the instantaneously still present adhesive effect of the adhesive and/or the temperature of the mask with adhesive can be taken into account. The pulling force difference can thus also be increased successively during the removal process.

After the detachment of the pellicle from the mask, the two can be transported separately, then cleaned and any defects which have occurred can be eliminated. Subsequently to this, a mask can again be provided with a pellicle and then inserted again.

BRIEF DESCRIPTION OF DRAWINGS

The invention will be explained in more detail by way of example in the following.

There are shown:

FIG. 4 shows an arrangement of a detector for the determination of mount positions according to an exemplary embodiment of the present invention; and FIG. 5 shows an exemplary embodiment of a pellicle removal unit according to the present invention.

Figure 1:
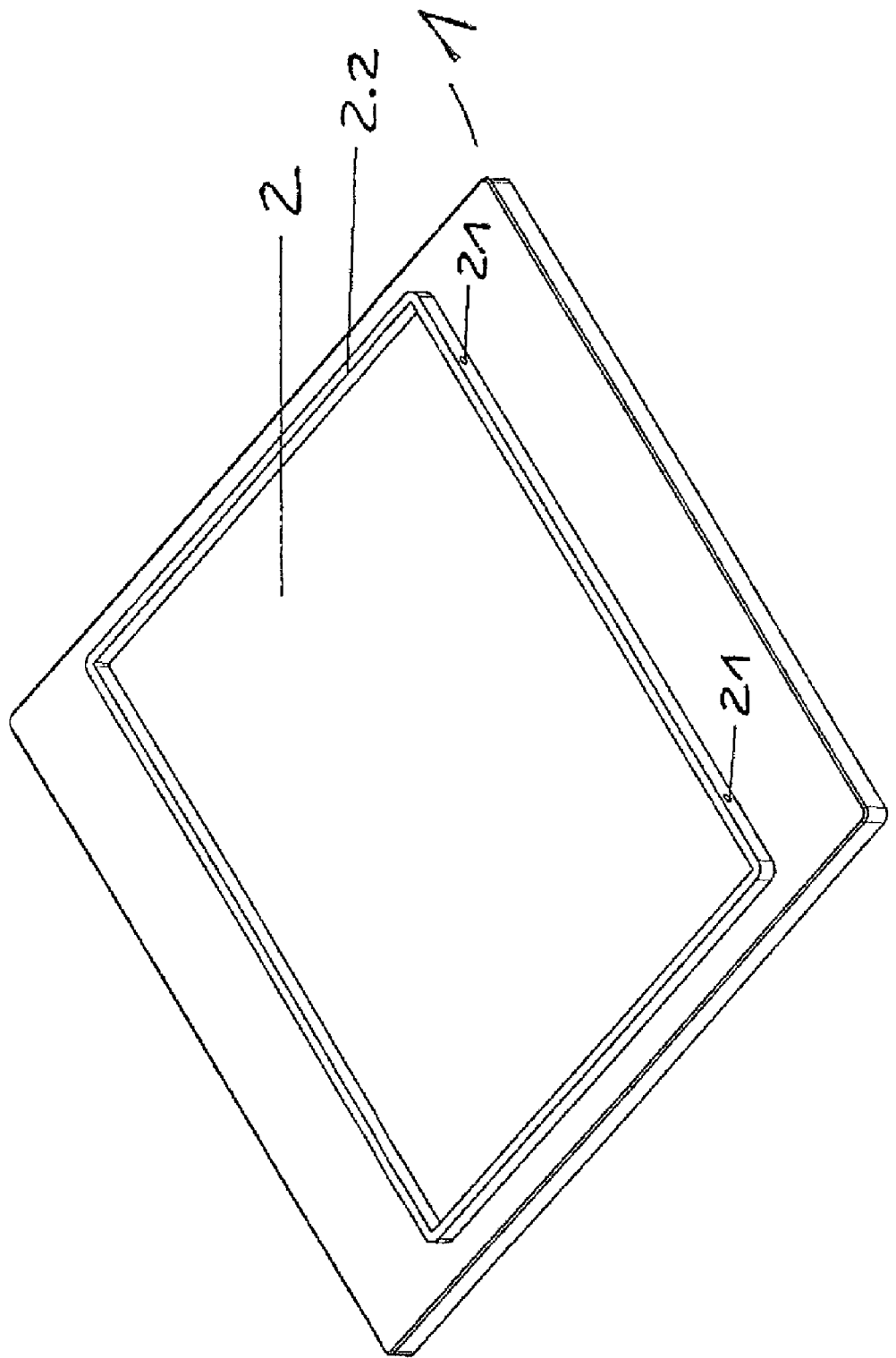
FIG. 1 shows a perspective representation of a mask with pellicle according to the present invention.

A perspective representation of a mask 1 with a pellicle 2 which is connected to the mask 1 by an adhesive is shown in FIG. 1. The connection with material continuity has been established between the lower edge of the frame of the pellicle 2 and the surface of the mask 1 on which the structure is formed. The adhesive can soften on heating and the pellicle 2 can then be removed from the mask 1. For this purpose and for the handling of the pellicle, four mounts 2.1 are provided at the radially outer edge of the pellicle frame 2.2 in the form of blind hole bores into which the spikes 5.1 of the pellicle removal unit 5 can also be introduced for the detachment of the pellicles 2. In this connection, two mounts 2.1 are each arranged at one side and two further mounts 2.1 are arranged at the side disposed opposite it. The upper side of the pellicle 2 is closed over its full area by the membrane 2.3 and thus hermetically covers the structure of the mask 1.

The pellicle frame 2.2 can have a different geometrical design and dimension. The mounts 2.1 can be arranged at different positions on different pellicles 2 and a pellicle 2 can be connected to the mask 1 in a non-defined manner. Asymmetrical, tilted or also symmetrical arrangements of pellicles 2 on masks 1 can thereby occur, which has to be taken into account in the automated removal of pellicles 2.

Figure 2:
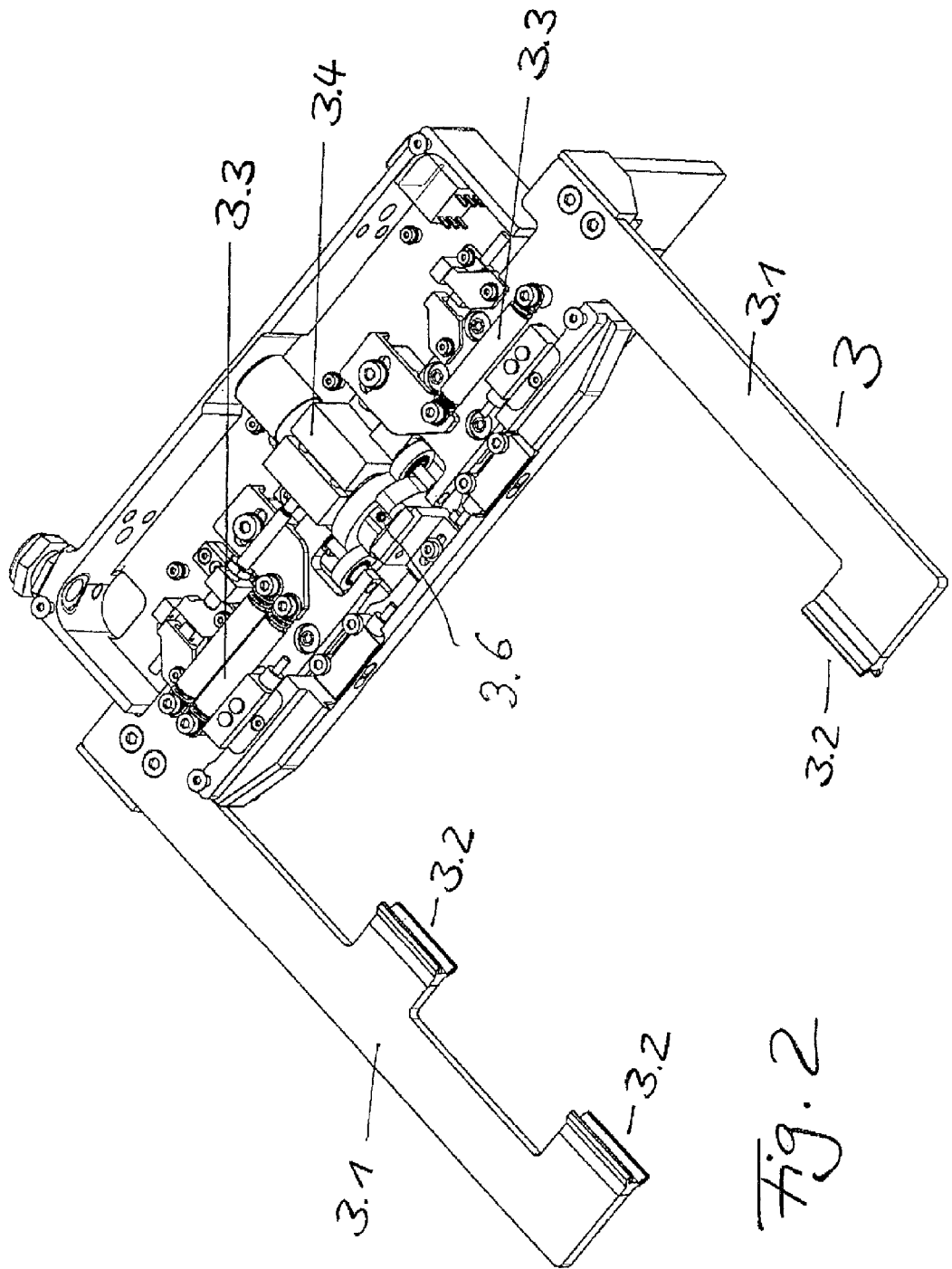
FIG. 2 shows an exemplary embodiment of a grip according to the present invention.
Figure 3:
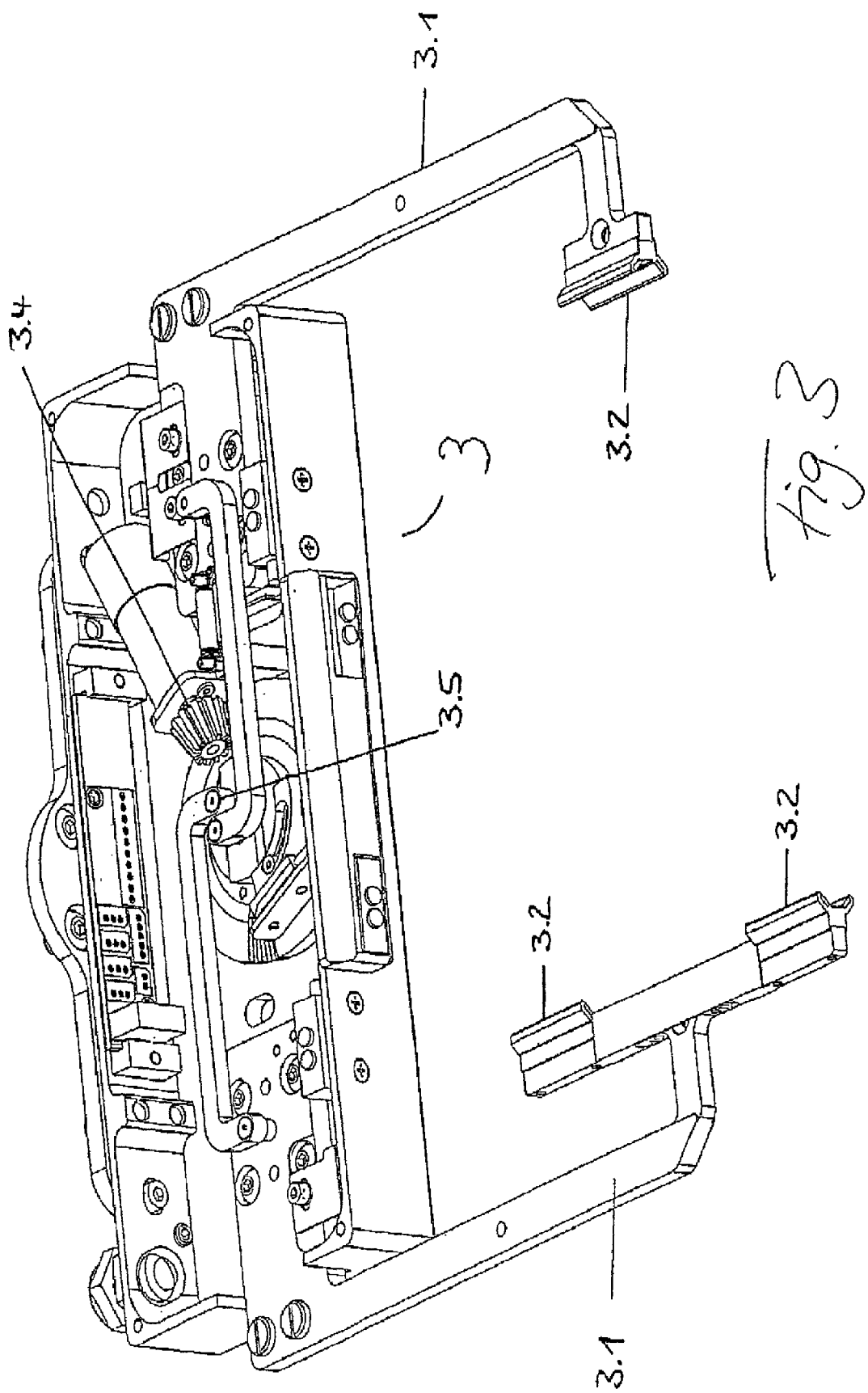
FIG. 3 shows a further exemplary embodiment of a grip according to the present invention.

A grip 3 can be used on an apparatus in accordance with the invention, as has been made clear in two examples in accordance with FIGS. 2 and 3.

In the example of a grip 3 shown in FIG. 2, two fixing elements 3.1 are present whose arms are aligned parallel to one another. The arms can be moved perpendicularly to their longitudinal axis in a linear fashion. They are received in suitable longitudinal guides for this purpose. Three mask holding elements 3.2 are present in a triangular arrangement at the fixing elements 3.1 and are designed such that a mask 1 can hold a mask 1 in shape-matched manner with them and by the pulling force of the springs 3.3 which engage at the fixing elements 3.1.

The fixing elements 3.1 are moved against the effective spring force, the spacing from one another is therefore increased, to release or also to receive a mask 1. A drive 3.4 is present for this purpose. In this connection, an electric motor rotates and moves eccentrically formed elements. The desired movement of the fixing elements 3.1 for the opening of the grip 3 can be achieved by their movement, optionally by direct contact. The eccentric elements can be a corresponding rotating disk then having two cams or also two cam disks.

The drive elements, springs and guides can be accommodated in a closed manner in a housing so that only the fixing elements 3.1 are exposed with their mask holding elements 3.2.

The grip 3 shown in FIG. 3 differs from this example in that a different drive 3.4 has been selected for the opening. In this connection, an electric motor moves two levers of a lever transmission 3.5 via a gear. The levers are again connected to the fixing elements 3.1 so that an already held mask 1 can be released or the grip 3 can be opened for the reception of a new mask 1. The clamping force, or also the restoring force, with which a mask 1 can be held in the grip 3 can also be applied here by springs 3.3 (not shown here) which engage directly at the fixing elements 3.1, but optionally also at the levers of the lever transmission 3.5.

A possible arrangement of a detector 4 for the determination of positions of the mounts 2.1 at pellicles 2 should be illustrated by FIG. 4. A video camera is used as a detector 4 here. A mask 1 with a pellicle 2 can be placed on the work table 6 (not shown). The detector 4 and the mask 1 can then be moved relative to one another. In this respect, the image data, and optionally also the positional data, of the detector 4 and/or of the work table 6 can be detected and taken into account in the position determination of the mounts 2.1.

After the position determination has taken place, the respective mask 1 can be supplied to a removal apparatus using the known position data. The mask 1 is inserted into a mask fixing unit therein and fastened securely in it.

A radiant heater can be arranged as the heating device beneath the mask 1 and the mask can be heated by it to the desired temperature resulting in the softening of the adhesive.

The pellicle 2 can then be detached from the mask 1 using the pellicle removal unit 5, of which an example is shown in FIG. 5, arranged on the oppositely disposed side of the mask 1.

In this connection, two respective linear drives 5.3 for spikes 5.1 introducible into the mounts 2.1 of the pellicle 2 are present at two oppositely disposed sides. The arrangement of the mounts 2.1 and optionally also a spacing of the mounts 2.1 at a pellicle side can thus be taken into account. If the longitudinal axes of the introducible spikes 5.1 are in alignment with those of the mounts 2.1, the spikes 5.1 can be introduced into the mounts 2.1 by a corresponding movement of the drives 5.3. Furthermore, a respective removal drive 5.2 is arranged above each of the four spikes 5.1. The pulling forces resulting in the detachment of the pellicles 2 can then be exerted by the removal drives 5.2.

The spikes 5.1 can be moved by the drives 5.3 in two axes aligned perpendicular to one another. This can also take place respectively individually for a spike 5.1 independently of the other spikes 5.1.

The removal drives 5.2 should, however, be controlled or regulated synchronously, with the deviation mentioned in the general part, however, nevertheless being taken into account for at least one of the removal drives 5.2.

The pellicle removal unit 5 can, however, also be moved vertically in total in order also to be able to take the third coordinate of the mounts 2.1 into account.

What is claimed is:

1. An apparatus for removal of a pellicle from a mask which is used for a photolithographic purpose, comprising:
    at least one grip manipulating the mask, the grip including at least two fixing elements which engage at an edge of the mask with an exerted pressure force;
    at least one detector contactlessly determining a position of mounts formed at a radially outer edge of the pellicle;
    a heating device heating an adhesive with which the pellicle is fastened with a material continuity to the mask; and
    a removal apparatus removing the pellicle from the mask, the removal apparatus including a mask fixing unit and a pellicle removal unit,
    wherein the fixing elements are prestressed by tension springs, the grip including a drive which has one of a lever transmission and eccentric elements, the drive engaging at the fixing elements for a release of the mask held by the grip.

2. The apparatus of claim 1, wherein the fixing elements engage at three points of the mask.

3. The apparatus of claim 1, wherein the pellicle removal unit includes a spike for each mount present at an outer edge of the pellicle, the spike being introducible into each mount, a pulling force acting at four mounts at a frame of the pellicle for the detachment of the pellicle from the mask.

4. The apparatus of claim 3, wherein the pellicle removal unit includes removal drives which act on the four introducible spikes, the removal drives applying the pulling force for the detachment of the pellicle from the mask.

5. The apparatus of claim 4, wherein the spikes are moved in a linear fashion by a biaxial drive and are vertically adjustable in an axis aligned perpendicular to a plane which is preset by these two axes.

6. The apparatus of claim 1, wherein the heating device directs an electromagnetic radiation onto a lower mask side.

7. The apparatus of claim 1, wherein the detector includes a video camera with an image processing.

8. An apparatus for removal of a pellicle from a mask which is used for a photolithographic purpose, comprising:
    at least one grip manipulating the mask, the grip including at least two fixing elements which engage at an edge of the mask with an exerted pressure force;
    at least one detector contactlessly determining a position of mounts formed at a radially outer edge of the pellicle;
    a heating device heating an adhesive with which the pellicle is fastened with a material continuity to the mask; and
    a removal apparatus removing the pellicle from the mask, the removal apparatus including a mask fixing unit and a pellicle removal unit,
    wherein the pellicle removal unit includes removal drives, and
    wherein one of the removal drives has a greater force effect than three further removal drives.

9. A method for removal of a pellicle from a mask which is used for a photolithographic purpose, comprising:
    positioning the mask using a grip with respect to a detector;
    detecting positions of mounts at a radially outer edge of the respective pellicle with the detector;
    fixing the mask with the pellicle in a pellicle removal unit;
    moving introducible spikes in such a manner that the spikes are aligned at the pellicle with respect to the previously detected positions of mounts;
    introducing the spikes into the mounts;
    heating the mask using a heating device to soften an adhesive with which the pellicle is connected with a material continuity to the mask; and
    exerting a pulling force onto the pellicle at an increased mask temperature via the spikes with the mask held in a mask fixing unit of the pellicle removal unit until the pellicle is detached from the mask,
    wherein a greater pulling force acts on one of the spikes than on the other spikes on the detachment of the pellicle.

10. The method of claim 9, wherein the pulling force applied to the pellicle via the spikes is successively increased up to the detachment of the pellicle.

11. The method of claim 9, wherein the pulling force is exerted perpendicularly with respect to a plane of the mask.

12. The method of claim 9, wherein the increased pulling force becomes effective after reaching at least one of a predefined pulling force value and a predefined mask temperature.

13. The method of claim 9, further comprising: measuring at least one of the respective pulling force and a torque on the detachment procedure of the pellicle from the mask.

14. The method of claim 9, further comprising: determining the position of at least one mount at the radially outer edge of the pellicle in a contactless manner by the detector.

15. The method of claim 9, further comprising: controlling an introduction of the spikes into the mounts of the pellicles using a triaxial drive while taking account of the positions of mounts.

16. A method for removal of a pellicle from a mask which is used for a photolithographic purpose, comprising:
- positioning the mask using a grip with respect to a detector;
- detecting positions of mounts at a radially outer edge of the respective pellicle with the detector;
- fixing the mask with the pellicle in a pellicle removal unit;
- moving introducible spikes in such a manner that the spikes are aligned at the pellicle with respect to the previously detected positions of mounts;
- introducing the spikes into the mounts;
- heating the mask using a heating device to soften an adhesive with which the pellicle is connected with a material continuity to the mask; and
- exerting a pulling force onto the pellicle at an increased mask temperature via the spikes with the mask held in a mask fixing unit of the pellicle removal unit until the pellicle is detached from the mask,
- wherein the mask is held by the fixing elements of the grip solely by the pulling force effect of springs and a drive engaging at the fixing elements only becomes effective for the release of the fixing elements.

\* \* \* \* \*